United States Patent [19]

Moran et al.

[11] Patent Number: 5,161,205

[45] Date of Patent: Nov. 3, 1992

[54] PROCESSING PICTURE SIGNALS

[75] Inventors: David Moran, Warrington; Octavius J. Morris, Redhill, both of England

[73] Assignee: U.S. Philips Corporation, New York, N.Y.

[21] Appl. No.: 683,351

[22] Filed: Apr. 9, 1991

[30] Foreign Application Priority Data

Apr. 23, 1990 [GB] United Kingdom ............... 9009052

[51] Int. Cl.⁵ ......................................... G06K 9/36
[52] U.S. Cl. ...................................... 382/56; 382/22; 358/135; 358/430
[58] Field of Search ............ 382/22, 56; 358/135, 358/426, 430

[56] References Cited

U.S. PATENT DOCUMENTS

| | | | |
|---|---|---|---|
| 3,769,453 | 10/1973 | Bahl et al. | 358/430 |
| 4,325,085 | 4/1982 | Gooch | 382/56 |
| 4,633,325 | 12/1986 | Usubuchi | 358/430 |
| 4,868,764 | 9/1989 | Richards | 382/56 |
| 5,025,478 | 6/1991 | Morris et al. | 382/22 |

*Primary Examiner*—Leo H. Boudreau
*Assistant Examiner*—David Fox
*Attorney, Agent, or Firm*—Leroy Eason

[57] ABSTRACT

A luminance picture signal is applied to segmentation device (2) and a modal filter (3) to produce a region signal. Both the picture signal and the region signal are applied to a subtractor circuit (5) to produce a texture signal which is encoded in an encoder (7). The region signal is also applied to an edge mapping device (9) to produce a region list signal and an edge map of the original image. The edge map is subjected in an element prediction device (10) to a template to produce a prediction from a look-up table in a memory (12) regarding the value of an element in a fixed position adjacent the template. If the prediction is correct then a prediction error signal indicates no error while if an error exists either the prediction error signal conveys the actual value or where it may be found in a look-up table. The prediction error signal is encoded in a second encoder (14).

19 Claims, 1 Drawing Sheet

PROCESSING PICTURE SIGNALS

BACKGROUND OF THE INVENTION

The present invention relates to a method of processing a picture signal for conveyance by means of a transmission path or storage medium, said method comprising the steps of:
  i) producing a picture signal which corresponds to a picture,
  ii) subjecting said picture signal to a segmentation algorithm to produce a region signal which identifies edges and closed regions in said picture,
  iii) producing a texture signal which corresponds to the difference between said picture signal and said region signal.

The invention also relates to a method of recovering such a picture signal and apparatus for use with the above methods.

DESCRIPTION OF THE RELATED ART

Such a method of decomposing a picture signal into two components using features identified in the original picture is well known. The two components then can be coded separately. The reasoning behind this approach is that by finding and encoding perceptually important features of the picture they will be preserved and that by the separation of the picture signal into two components of very different character it is possible to design efficient codes for each of them. Image bandwidth compression aims to reduce the amount of information that must be transmitted while simultaneously preserving the quality of the decoded picture. Region coding schemes so far proposed with good compression tend to be complex.

SUMMARY OF THE INVENTION

It is an object of the invention to provide a method and apparatus for processing a picture signal in which the amount of information to be encoded can be reduced.

The invention provides a method of processing a picture signal for conveyance by means of a transmission path or storage medium, said method comprising the steps of:
  i) producing a picture signal which corresponds to a picture,
  ii) subjecting said picture signal to a segmentation algorithm to produce a region signal which identifies edges and closed regions in said picture,
  iii) producing a texture signal which corresponds to the difference between said picture signal and said region signal,
characterised in that said method comprises the further steps of:
  iv) producing an edge map signal form said region signal,
  v) successively scanning the elements of said edge map signal by means of a template corresponding to a fixed group of adjacent elements in a given configuration,
  vi) determining the content of said fixed group of elements for each part of said successive scanning, and
  vii) predicting from each content determination the value of an additional element in a given position adjacent to but outside said fixed group of elements.

The above method has the advantage that it provides a less complex coding scheme than previously proposed whilst still providing good compression.

During a learning phase the successive scanning of said elements by said template may be used to produce a stored table which contains for each combination of values of the elements in said fixed group the most predominant value of said additional element. Alternatively during such a phase the successive scanning of said elements by said template may be used to produce a stored table which contains for each combination of values of the elements in said fixed group a ranked list of values of said additional element in the order of predominance.

The prediction for each additional element may be derived from a stored table which contains for each combination of values of the elements in said fixed group the most predominant value of said additional element, the value of said prediction being compared with the actual value of said additional element to determine whether or not there is an error in said prediction and to produce a prediction error signal which indicates the value for said additional element if there is an error.

The prediction for each additional element alternatively may be derived as the most predominant from a stored table which contains for each combination of values of the elements in said fixed group a ranked list of values of said additional element in the order of predominance, the value of said prediction being compared with the actual value of said additional element to determine whether or not there is an error in said prediction and if an error exists to which one of said stored ranked list the actual value corresponds and to produce a prediction error signal which indicates the position of the correct value in said stored table if there is an error.

The invention also provides a method of recovering a picture signal received in the form of a first component related to the regions of said picture signal and a second component related to the texture of said picture signal, said method comprising the steps of:
  i) receiving said region related component and producing a region signal therefrom,
  ii) receiving said texture related component and producing a texture signal therefrom,
  iii) combining said region signal and said texture signal to reproduce said picture signal,
characterised in that said region related component conveys information regarding predictions made prior to reception, said method comprising the further steps of:
  iv) reproducing from said region related component an edge map signal,
  v) successively scanning the elements of said edge map signal by means of a template corresponding to a fixed group of adjacent elements in a given configuration,
  vi) determining the content of said fixed group of elements for each part of said successive scanning,
  vii) predicting from each content determination the value of an additional element in a given position adjacent to but outside said fixed group of elements,
  viii) reconstructing an edge map from the predicted values where no error is indicated by said region related component and from corrected values where the predicted values are in error under the control of said region related component, and ix) forming said region signal from said reconstructed edge map.

The predicted values may be contained within a stored table which corresponds to a table by means of which said predictions are made prior to reception. Where the predicted values are in error said corrected values may be conveyed with said region related component. Alternatively said corrected values may be derived from said stored table which contains a ranked list of values of additional elements.

A region list signal may also be received which contains parameters describing the luminance for each region in a predefined order and using said region list signal in the formation of said region signal.

The invention further provides apparatus for processing a picture signal for conveyance by means of a transmission path or storage medium, said apparatus comprising means for producing a picture signal which corresponds to a picture, means for subjecting said picture signal to a segmentation algorithm to produce a region signal which identifies edges and closed regions in said picture, and means for producing a texture signal which corresponds to the difference between said picture signal and said region signal, characterised in that said apparatus additionally comprises means for producing an edge map signal from said region signal, means for successively scanning the elements of said edge map signal by means of a template corresponding to a fixed group of adjacent elements in a given configuration, means for determining the content of said fixed group of elements for each part of said successive scanning, and means for predicting from each content determination the value of an additional elements in a given position adjacent to but outside said fixed group of elements.

During a learning phase means may be provided for the successive scanning of said elements by said template to produce in a memory a stored table containing for each combination of values of the elements in said fixed group the most predominant value of said additional element. Alternatively during such a phase means may be provided for the successive scanning of said elements by said template to produce in a memory a stored table which contains for each combination of values of the elements in said fixed group a ranked list of values of said additional element in the order of predominance.

Means may be provided for deriving from a stored table containing for each combination of values of the elements in said fixed group the most predominant value of said additional element, the prediction for each additional element, for comparing the value of said prediction with the actual value of said additional element to determine whether or not there is an error in said prediction and for producing a prediction error signal from said comparison which indicates the value for said additional element if there is an error.

Means may further be provided for deriving the most predominant from a stored table which contains for each combination of values of the elements in said fixed group a ranked list of values of said additional element in the order of predominance as the prediction for each additional element and for comparing its value with the actual value of said additional element to determine whether or not there is an error in said prediction and if an error exists to which one of said stored ranked list the actual value corresponds and for producing a prediction error signal from said comparison which indicates the position of the correct value in said stored table if there is an error.

The invention additionally provides apparatus for recovering a picture signal received in the form of a first component related to the regions of said picture signal and a second component related to the texture of said picture signal, said apparatus comprising means for receiving said region related component and producing a region signal therefrom, means for receiving said texture related component and producing a texture signal therefrom, and means for combining said region signal and said texture signal to reproduce said picture signal, characterised in that said region related component conveys information regarding predictions made prior to reception, said apparatus further comprising means for reproducing from said region related component an edge map signal, means for successively scanning the elements of said edge map signal by means of a template corresponding to a fixed group of adjacent elements in a given configuration, means for determining the content of said fixed group of elements for each part of said successive scanning, means for predicting from each content determination the value of an additional element in a given position adjacent to but outside said fixed group of elements, means for reconstructing an edge map from the prediceted values where no error is indicated by said region related component and from corrected values where the predicted values are in error under the control of said region related component, and means for forming said region signal from said reconstructed edge map.

A stored table containing the predicted values may also be provided which stored table corresponds to a table by means of which said predictions are made prior to reception and may additionally comprise means for deriving said corrected values from said region related component when the predicted values are in error. Alternatively the stored table may contain a ranked list of values of additional elements when the predicted values are in error.

BRIEF DESCRIPTION OF THE DRAWINGS

The above and other features of the invention will now be described by way of example with reference to the accompanying drawings, in which.

DESCRIPTION OF THE PREFERRED EMBODIMENTS

Figure 1:
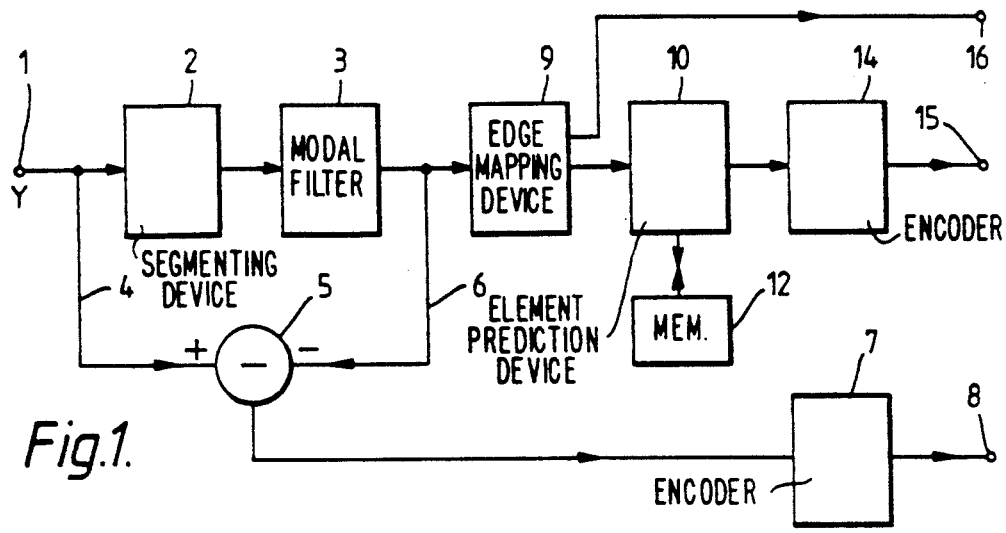
FIG. 1 is a block diagram of signal generation apparatus according to the present invention.

In the block diagram of FIG. 1 the reference 1 indicates a terminal for receiving a digitised luminance signal Y which is applied to the input of a segmentation device 2 in which the luminance signal is subjected to a segmentation algorithm which establishes regions of similar intensity in the image represented by the luminance signal Y and the contours surrounding the regions. The resulting segmented luminance signal is applied to a modal filter 3 in which edges are straightened, where necessary, by replacing isolated pixels along the region boundaries. The luminance signal Y is also conveyed over a connection 4 to the (+) input of a substractor circuit 5 whose (−) input receives over a connection 6 the processed segmented luminance signal. The output of the subtractor circuit 5 is a luminance texture signal which is applied to an encoder 7 to produce at an output terminal 8 the encoded luminance texture signal for application to a transmission path or a storage medium with or without further processing, as necessary.

Figure 2:
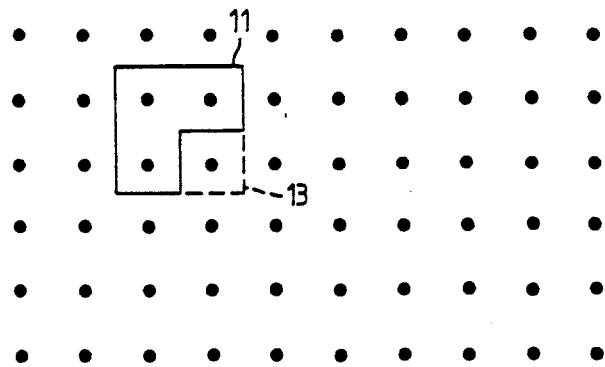
FIG. 2 is a diagram of a template which may be used with apparatus according to the invention.

The segmented luminance region signal from the modal filter 3 is also applied to an edge mapping device 9 which produces an edge map of the original image and a region list signal containing the parameters describing the luminance for each region in a predefined order. This region list signal is applied to a second output terminal 16 for application to the transmission path or storage medium with or without further processing, as necessary. The resulting edge map signal from device 9 is applied to an element prediction device 10 in which the elements of that signal are successively scanned by means of a template (in an electronic manner) which corresponds to a fixed group of adjacent elements in a given configuration. As an example such a template 11 is shown in FIG. 2 in solid line form which surrounds three elements (shown as dots), the group comprising two adjacent elements on one line and an adjacent element on the next line. During a learning phase the template 11 is moved across the whole frame for a number of images and for each group of three elements within the template their values are stored in a memory 12 (FIG. 1) together with the value for an additional (fourth) element immediately adjacent the template and contained within the broken line extension 13 to the template 11 (FIG. 2). Here the value stored for each fourth element relates to whether or not an edge is present, the direction of the edge and whether the element forms a junction or corner between regions. From the results of this examination a look-up table is produced in the memory 12 which contains for each combination of values within the template 11 the predominant value for the fourth element or different values obtained for each fourth element and their ranking based on the number of times each value appears.

During the operating phase the edge map signal for the images under consideration has each whole frame successively examined in the device 10 by means of the electronic template 11 (FIG. 2). The values found for each group of elements within the template are applied to the memory 12 and a predicted value for the fourth elements (within the broken line 13) is obtained from the look-up table in the memory in the case where the look-up table only contains one such (the predominant) value. This predicted value is then compared in the device 10 with the actual value in the edge map signal. If these two values correspond then a "no error" signal is produced and conveyed to a second encoder 14. If the predicted value does not agree with the actual value then this error can be signalled and the actual value conveyed to the encoder 14. However, if the look-up table contains a number of ranked predictions for the fourth element then these predicted values will be compared, in their order of ranking starting with the most predominant, with the actual value. If the most predominant predicted value corresponds to the actual value then a "no-error" signal may be produced as before but if these values do not agree then the comparison continues with each predicted value in turn until correspondence is achieved. Then either the actual value can be conveyed to the encoder 14 or the position of this actual value in the look-up table, it being assumed that the receiving apparatus contains the same look-up table as that in the transmission apparatus. In the latter case instead of signalling "no error" the correspondence between the most predominant predicted value and the actual value may also be signalled by the position of the most predominant in the look-up table. Whichever error related signal is encoded at the encoder 14, the resulting encoded output is applied to a third output terminal 15 as a prediction error signal for application to a transmission path or a storage medium with or without further processing, as necessary.

The prediction error signal may be encoded to form an error bit map which can indicate for each element position whether or not an error exists in the prediction. The bit map may be sub-divided into a number of blocks of elements and short codes may be used for such blocks where the predictions are correct or the errors are small but where the errors are complex then longer codes will need to be employed. A suitable variable length code with minimum redundancy for such a purpose is the Huffman code. The block codes can indicate boundary and direction information for groups of elements. The prediction error signal may also convey the actual values for an element when the prediction is incorrect or an indication as to the position in the look-up table where the correct values can be found. Again these may be conveyed as block codes. On assembling an error bit map decisions as to whether a prediction is good or bad may be assembled such that good predictions are assigned sequentially to one part of the map whilst bad predictions are assigned sequentially to a different part of the map. This allows the error bit map to be coded in the most efficient manner as different code books can be used for each part.

Figure 3:
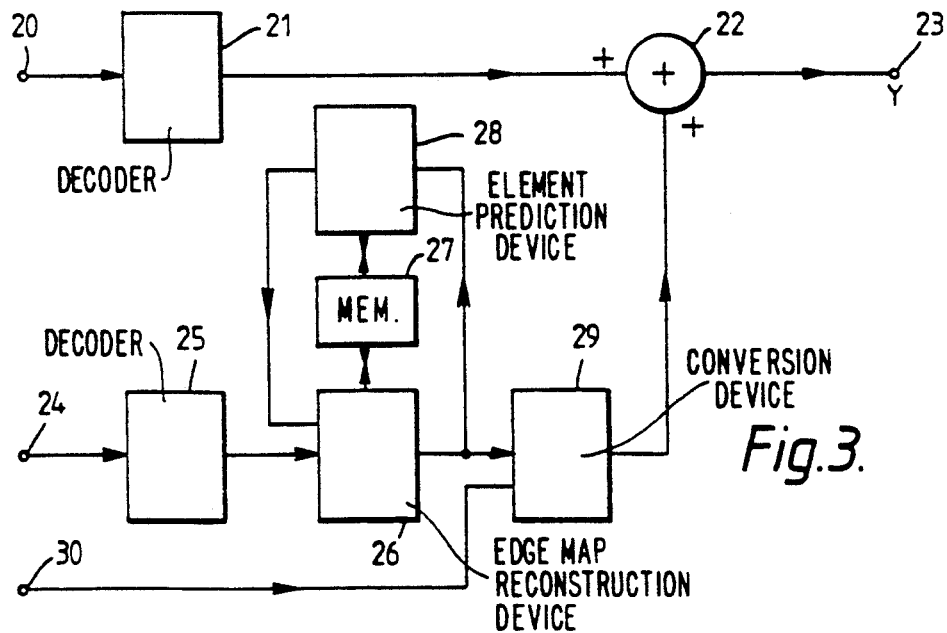
FIG. 3 is a block diagram of signal reconstruction apparatus according to the present invention.

FIG. 3 is a block diagram of receiving apparatus for recovering an image signal from the signals produced by the apparatus of FIG. 1. An input terminal 20 receives the encoded luminance texture signal from the transmission path or storage medium which is applied to a decoder 21 to produce the luminance texture signal. This is applied to a first (+) input of an adder circuit 22 whose other (+) input receives the reconstituted luminance region signal as will be described hereinafter. The adder circuit 22 produces at its output the reconstructed luminance signal Y which is applied to an output terminal 23. A second input terminal 24 receives the encoded prediction error signal from the transmission path or storage medium which is applied to a second decoder 25 to produce the prediction error signal. This singal is applied to a first input of an edge-map reconstruction device 26 which reconstructs the edge map produced by the edge mapping device 9 of FIG. 1. To start the reconstruction procedure the transmission apparatus of FIG. 1 and the receiving apparatus of FIG. 3 both have agreed starting elements along two adjacent sides in the edge map with agreed values for these elements. The value of these elements may be specifically transmitted or may be assumed to have all zeros in which case they may be immediately outside the actual edge map. These elements may be contained in the first rows in the horizontal and vertical directions and assembled in the device 26 for application to an element prediction device 28 similar to that shown at 10 in FIG. 1. In the device 28 the same electronic template as that used for FIG. 1, i.e. that shown in FIG. 2, is applied to these elements and others as they are reconstructed and a prediction made for each fourth element bounded by the broken line 13

(FIG. 2) using a look-up table in a memory 27 which is also connected to device 28. This look-up table corresponds to that in memory 12 in the transmission apparatus of FIG. 1. Each prediction will be the value stored if a sole prediction is stored for each combination of template values or the most predominent value if a ranked order of values are stored for each combination of template values. The predicted values are applied to a second input of the reconstruction device 26 where it is established from the prediction error signal received at its first input if the prediction is correct. If a predicted value is in error then it is replaced by the correct value either conveyed with the prediction error signal or obtained from the look-up table (where a ranking system is employed) under the control of the prediction error signal. In this way each element is reconstructed from the predictions made as a result of applying the electronic template to already reconstructed groups of elements to produce a reconstructed edge map signal at the output of the reconstruction device 26. This edge map signal is additionally applied to a conversion device 29 which also receives the region list signal containing the parameters describing the luminance for each region in a predefined order from a further input 30. In the conversion device 29 the edge map signal is converted into a region signal corresponding to that produced by segmentation and filtering at the transmission end (FIG. 1) and which is applied to the other (+) input of the adder circuit 22.

In the above description reference is made only to the processing of a luminance signal Y. However the invention is equally suitable for processing chrominance components U and V as well as the luminance signal Y. This may be done by separate parallel processing of the chrominance components U and V or by not subjecting these components to segmentation but to use the results of the segmentation algorithm applied to the luminance signal Y to define regions in these chrominance components which in turn are used to produce two chrominance texture signals.

From reading the present disclosure, other modifications will be apparent to persons skilled in the art. Such modifications may involve other features which are already known in the design, manufacture and use of apparatus for processing picture signals and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of processing a picture signal for conveyance by means of a transmission path or storage medium, said method comprising the steps of:
   i) producing a picture signal which corresponds to a picture,
   ii) subjecting said picture signal to a segmentation algorithm to produce a region signal which identifies edges and closed regions in said picture,
   iii) producing a texture signal which corresponds to the difference between said picture signal and said region signal,
   characterised in that said method comprises the further steps of:
   iv) producing an edge map signal from said region signal,
   v) successively scanning the elements of said edge map signal by means of a template corresponding to a fixed group of adjacent elements in a given configuration,
   vi) determining the content of said fixed group of elements for each part of said successive scanning, and
   vii) predicting from each content determination the value of an additional element in a given position adjacent to but outside said fixed group of elements.

2. A method as claimed in claim 1, characterised in that during a learning phase the successive scanning of said elements by said template is used to produce a stored table which contains for each combination of values of the elements in said fixed group the most predominant value of said additional element.

3. A method as claimed in claim 1, characterised in that during a learning phase the successive scanning of said elements by said template is used to produce a stored table which contains for each combination of values of the elements in said fixed group a ranked list of values of said additional element in the order of predominance.

4. A method as claimed in claim 1, characterised in that the prediction for each additional element is derived from a stored table which contains for each combination of values of the elements in said fixed group the most predominant value of said additional element, the value of said prediction being compared with the actual value of said additional element to determine whether or not there is an error in said prediction and to produce a prediction error signal which indicates the value for said additional element if there is an error.

5. A method as claimed in claim 1, characterised in that the prediction for each additional element is derived as the most predominant from a stored table which contains for each combination of values of the elements in said fixed group a ranked list of values of said additional element in the order of predominance, the value of said prediction being compared with the actual value of said additional element to determine whether or not there is an error in said prediction and if an error exists to which one of said stored ranked list the actual value corresponds and to produce a prediction error signal which indicates the position of the correct value in said stored table if there is an error.

6. A method of recovering a picture signal received in the form of a first component related to the regions of said picture signal and a second component related to the texture of said picture signal, said method comprising the steps of:
   i) receiving said region related component and producing a region signal therefrom,
   ii) receiving said texture related component and producing a texture signal therefrom,
   iii) combining said region signal and said texture signal to reproduce said picture signal, characterised in that said region related component conveys information regarding predictions made prior to reception, said method comprising the further steps of:

iv) reproducing from said region related component an edge map signal, v) successively scanning the elements of said edge map signal by means of a template corresponding to a fixed group of adjacent elements in a given configuration, vi) determining the content of said fixed group of elements for each part of said successive scanning, vii) predicting from each content determination the value of an additional element in a given position adjacent to but outside said fixed group of elements, viii) reconstructing an edge map from the predicted values where no error is indicated by said region related component and from corrected values where the predicted values are in error under the control of said region related component, and ix) forming said region signal from reconstructed edge map.

7. A method as claimed in claim 6, characterised in that the predicted values are contained within a stored table which corresponds to a table by means of which said predictions are made prior to reception.

8. A method as claimed in claim 6, characterised in that where the predicted values are in error said corrected values are conveyed with said region related component.

9. A method as claimed in claim 7, characterised in that where the predicted values are in error said corrected values are derived from said stored table which contains a ranked list of values of additional elements.

10. A method as claimed in claim 6, characterised by receiving a region list signal which contains parameters describing the luminance for each region in a predefined order and using said region list signal in the formation of said region signal.

11. Apparatus for processing a picture signal for conveyance by means of a transmission path or storage medium, said apparatus comprising means for producing a picture signal which corresponds to a picture, means for subjecting said picture signal to a segmentation algorithm to produce a region signal which identifies edges and closed regions in said picture, and means for producing a texture signal which corresponds to the difference between said picture signal and said region signal, characterised in that said apparatus additionally comprises means for producing an edge map signal from said region signal, means for successively scanning the elements of said edge map signal by means of a template corresponding to a fixed group of adjacent elements in a given configuration, means for determining the content of said fixed group of elements for each part of said successive scanning, and means for predicting from each content determination the value of an additional element in a given position adjacent to but outside said fixed group of elements.

12. Apparatus as claimed in claim 11, characterised in that during a learning phase means are provided for the successive scanning of said elements by said template to produce in a memory a stored table containing for each combination of values of the elements in said fixed group the most predominant value of said additional element.

13. Apparatus as claimed in claim 11, characterised in that during a learning phase means are provided for the successive scanning of said elements by said template to produce in a memory a stored table which contains for each combination of values of the elements in said fixed group a ranked list of value of said additional element in the order of predominance.

14. Apparatus as claimed in claim 11, characterised in that means are provided for deriving from a stored table containing for each combination of values of the elements in said fixed group the most predominant value of said additional element, the prediction for each additional element, for comparing the value of said prediction with the actual value of said additional element to determine whether or not there is an error in said prediction, and for producing a prediction error signal from said comparison which indicates the value of said additional element if there is an error.

15. Apparatus as claimed in claim 11, characterised in that means are provided for deriving the most predominant from a stored table which contains for each combination of values of the elements in said fixed group a ranked list of values of said additional element in the order of predominance as the prediction for each additional element, for comparing its value with the actual value of said additional element to determine whether or not there is an error in said prediction and if an error exists to which one of said stored ranked list the actual value corresponds, and for producing a prediction error signal from said comparison which indicates the position of the correct value in said stored table if there is an error.

16. Apparatus for recovering a picture signal received in the form of a first component related to the regions of said picture signal and a second component related to the texture of said picture signal, said apparatus comprising means for receiving said region related component and producing a region signal therefrom, means for receiving said texture related component and producing a texture signal therefrom, and means for combining said region signal and said texture signal to reproduce said picture signal, characterised in that said region related component conveys information regarding predictions made prior to reception, said apparatus further comprising means for reproducing from said region related component an edge map signal, means for successively scanning the elements of said edge map signal by means of a template corresponding to a fixed group of adjacent elements in a given configuration, means for determining the content of said fixed group of elements for each part of said successive scanning, means for predicting from each content determination the value of an additional element in a given position adjacent to but outside said fixed group of elements, means for reconstructing an edge map from the predicted values where no error is indicated by said region related component and from corrected values where the predicted values are in error under the control of said region related component, and means for forming said region signal from said reconstructed edge map.

17. Apparatus as claimed in claim 16, characterised in that said apparatus additionally comprises a stored table containing the predicted values which stored table corresponds to a table by means of which said predictions are made prior to reception.

18. Apparatus as claimed in claim 16, characterised in that said apparatus additionally comprising means for deriving said corrected values from said region related component when the predicted values are in error.

19. Apparatus as claimed in claim 17, characterised in that said apparatus additionally comprising means for deriving said corrected values from said stored table which contains a ranked list of values of additional elements when the predicted values are in error.

* * * * *